US006631057B1

(12) United States Patent
Allenspach et al.

(10) Patent No.: US 6,631,057 B1
(45) Date of Patent: Oct. 7, 2003

(54) MAGNETIC DEVICE WITH FERROMAGNETIC LAYER CONTACTING SPECIFIED YTTRIUM OR RARE EARTH ELEMENT OXIDE ANTIFERROMAGNETIC LAYER

(75) Inventors: Rolf Allenspach, Adliswil (CH); Jean Fompeyrine, Waedenswil (CH); Eric Fullerton, Morgan Hill, CA (US); Jean Pierre Locquet, Horgen (BE); Timothy Moran, Springfield, CA (US); Maria Seo, Lausanne (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/521,155

(22) Filed: Mar. 8, 2000

(30) Foreign Application Priority Data

Mar. 19, 1999 (EP) .............................. 99105662

(51) Int. Cl.⁷ ................................ G11B 5/39
(52) U.S. Cl. ................................ 360/324.11
(58) Field of Search ..................... 360/324.11

(56) References Cited

U.S. PATENT DOCUMENTS

| 3,645,787 A | | 2/1972 | Mee et al. |
|---|---|---|---|
| 4,103,315 A | | 7/1978 | Hempstead et al. |
| 4,621,030 A | * | 11/1986 | Uesaka et al. |
| 5,859,754 A | * | 1/1999 | Tong et al. |

FOREIGN PATENT DOCUMENTS

| EP | 0794581 | 9/1997 |
|---|---|---|
| EP | 0794581 A1 | 9/1997 |
| GB | 1319474 | 6/1973 |
| JP | 5-234753 | 9/1993 |
| JP | 9-148651 | 6/1997 |
| JP | 51-017720 | 6/1997 |

OTHER PUBLICATIONS

Liu, Thin–Film Surface Bias on Magnetic Bubble Materials, Journal of Applied Physics, vol. 42, No. 4, pp. 1360–1361 (Mar. 15, 1971).

Bobeck, Properties and Device Applications of Magnetic Domains in Orthoferites, Bell System Technical Journal, Oct. 1967, pp. 1901–1925.

Journal of Applied Physics, vol. 42, No. 4, pp. 1360–1361; Mar. 15, 1971.

Journal of Japan Applied Magnetics Society, vol. 22, No. 1 (1998); pp. 12–17.

Handbook of Magnetic Substance, pp. 679–687; Asakura Shoten; Jun. 30, 1975.

* cited by examiner

*Primary Examiner*—Craig A. Renner
(74) *Attorney, Agent, or Firm*—G. Marlin Knight; Ronald Feece; Bracewell & Patterson, L.L.P.

(57) ABSTRACT

The present invention concerns at least an antiferromagnetic layer, which is in direct contact with a ferromagnetic layer for inducing an exchange bias in the ferromagnetic layer. Thus, the ferromagnetic layer is pinned by the antiferromagnetic layer, also referred to as the pinning layer. The antiferromagnetic or pinning layer comprises a compound from the group of orthoferrites, which show a variety of advantages. For example, these antiferromagnets can have a Néel temperature $T_N$ ranging from at least 623 K to 740 K depending on the compounds, and they can display a weak ferromagnetic moment. Therefore, a magnetic device comprising the mentioned structure can be used properly in an environment of a high operating temperature. The compound can be described by the formula $RFe_{1-x}TM_xO_3$ with R a rare earth element or Yttrium, and TM a transition metal which can be one element of the groups IB to VIII. The compound can be also doped by an element S being an element with another valence, such as Barium, Nickel, Strontium, Calcium, Potassium, or Sodium in compound $R_{1-x}S_xFeO_3$.

6 Claims, 5 Drawing Sheets

MAGNETIC DEVICE WITH FERROMAGNETIC LAYER CONTACTING SPECIFIED YTTRIUM OR RARE EARTH ELEMENT OXIDE ANTIFERROMAGNETIC LAYER

BACKGROUND OF THE INVENTION

1. Cross-Reference to Related Application

The present application claims priority to European Application Number 99105662.3, filed on Mar. 19, 1999 by R. Allenspach et al., assigned to the assignee of the present application.

2. Technical Field

The present invention relates to magnetic devices and generally to devices having a pinning layer. More particularly the invention relates to magnetic memories (MRAM) and magnetoresistive sensors based on the so-called "spin-value" or "giant magnetoresistive (GMR)" effect. Although the present invention is applicable in a variety of magnetic applications it will be described with the focus put on an application to magnetoresistive sensors as GMR sensors, for example.

3. Description of the Related Art

The change in electrical resistance of a material in response to a magnetic field is called magnetoresistance which has made it possible to read information on a magnetic medium, such as a computer hard disk. The prior art discloses a magnetic read tranducer referred to as a magnetoresistive (MR) sensor or head which has been shown to be capable of reading data from a magnetic surface at great linear densities. A MR sensor detects magnetic field signals through the resistance changes of a read element fabricated of a magnetic material as a function of the strength and direction of magnetic flux being sensed by the read element. These prior art MR sensors operate on the basis of the anisotropic magnetoresistive (AMR) effect in which a component of the read element resistance varies as the square of the cosine of the angle between the magnetization and the direction of sense current flow through the element. A more detailed description of the AMR effect can be found in "Memory, Storage, and Related Applications", D. A. Thompson et al., IEEE Trans. Mag. MAG-11, p. 1039 (1975).

More recently, a different, more pronounced magnetoresistive effect has been described in which the change in resistance of a layered magnetic sensor is attributed to the spin-dependent transmission of the conduction electrons between the magnetic layers through a nonmagnetic layer and the accompanying spin-dependent scattering of electrons at the layer interfaces and within the ferromagnetic layers. This magnetoresistive effect is variously referred to as the "giant magnetoresistive" (GMR) or "spin valve" effect. A magnetoresistive sensor based on the before-mentioned effect provides improved sensitivity and greater change in resistance than observed in sensors utilizing the AMR effect. The electrical resistance read-out means that the signal is much stronger in such GMR sensors. The increased signal offered in the GMR sensor allows more information to be stored on a hard disk. For a bit that aligns the ferromagnetic layers parallel under the GMR sensor, the resistance goes down, the electrons do not scatter very much and the current flow increases. Such a sensor can also use a multifilm laminated pinned ferromagnetic layer in place of the conventional single-layer pinned layer.

U.S. Pat. No. 4,949,039 to Grunberg describes a layered magnetic structure which yields enhanced MR effects caused by a antiparallel alignment of the magnetizations in the magnetic layers. Grunberg describes the use of antiferromagnetic-type exchange coupling to obtain the antiparallel alignment of the magnetizations in the magnetic layers. Grunberg describes the use of antiferromagnetic-type exchange coupling to obtain the antiparallel alignment in which adjacent layers of ferromagnetic materials are separated by a thin interlayer of Cr or Y.

U.S. Pat. No. 5,206,590 to Dieny et al. discloses a MR sensor in which the resistance between two uncoupled ferromagnetic layers is observed to vary as the cosine of the angle between the magnetizations of the two layers. This mechanism produces a magnetoresistance that is based on the spin valve effect and, for selected combinations of materials, is greater in magnitude than the AMR.

The U.S. Pat. No. 5,159,513 to Dieny et al. discloses a MR sensor based on the above-described effect which includes two thin layers of ferromagnetic material separated by a thin film layer of a nonmagnetic metallic material wherein at least one of the ferromagnetic layers is of a cobalt or a cobalt alloy. The magnetization of the one ferromagnetic layer is maintained perpendicular to the magnetization of the other ferromagnetic layer at zero externally applied magnetic field by exchange coupling to an antiferromagnetic layer.

Published European Patent Application EP-A-0,585,009 discloses a spin valve effect sensor in which an antiferromagnetic and an adjacent magnetically soft layer cooperate to fix or pin the magnetization of a ferromagnetic layer. The magnetically soft layer enhances the exchange coupling provided by the antiferromagnetic layer.

The spin valve structures described in the above-cited U.S. patents and European patent application require that the direction of magnetization in one of the two ferromagnetic layers be fixed or "pinned" in a selected orientation such that under non-signal conditions the direction of magnetization in the other ferromagnetic layer, the "free" layer, is oriented either perpendicular to (i.e. at 90°) or antiparallel to (i.e. at 180°) the direction of magnetization of the pinned layer. When an external magnetic signal is applied to the sensor, the direction of magnetization in the non-fixed or "free" layer rotates with respect to the direction of magnetization in the pinned layer. The output of the sensor depends on the amount of this rotation. In order to maintain the magnetization orientation in the pinned layer, a means for fixing the direction of the magnetization is required. For example, as described in the above-cited prior art documents, an additional layer of antiferromagnetic material can be formed adjacent to the pinned ferromagnetic layer to provide an exchange coupled bias field and thus pinning. Alternatively, an adjacent magnetically hard layer can be utilized to provide hard bias for the pinned layer.

Another magnetic device is a magnetic random access memory (MRAM) which is a non-volatile memory. This memory basically includes a GMR cell, a sense line, and a word line. The MRAM employs the GMR effect to store memory states. Magnetic vectors in one or all of the layers of GMR material are switched very quickly from one direction to an opposite direction when a magnetic field is applied to the GMR cell over a certain threshold. According to the direction of the magnetic vectors in the GMR cell, states are stored, and the GMR cell maintains these states even without a magnetic field being applied. The states stored in the GMR cell can be read by passing a sense current through the cell in a sense line and sensing the difference between the resistances (GMR ration) when one or both of the magnetic vectors switch. The problem is that in most GMR cells the GMR ratio is relatively low (e.g. 10% or less) and, consequently, reading or sensing the state stored in the GMR cell can be relatively difficult.

In general, magnetic devices often use an antiferromagnetic layer to pin the magnetic moment of a subsequently deposited ferromagnetic layer. Typically used materials are FeMN, NiMn, CoO, NiO, and TbCoFe. The main advantage of using exchange bias is that the bias field cannot be reset or changed accidently during the lifetime of the device. To reset the antiferromagnet it is necessary to cool the antiferromagnet from above its Néel temperature in the presence of a magnetic field. A disadvantage of FeMn is that this material is a metal and allows a current flow. Therefore, FeMn is not ideally suited as pinning material. NiO is an insulator, thus having the disadvantage that the strength of the pinning, i.e. the exchange bias, is not as strong as desired.

Since the load of data which have to be stored increases dramatically, there is a need for faster operation in read and write processes with higher density. Thus, the operating temperature of the data storage systems is increasing. Today's sensors show some drawbacks and are hence not suitable for new generations. For example, the currently used antiferromagnet in GMR sensors is NiO with a Néel temperature $T_N$ of about 450 K whereas the operation temperature of the head is about 400 K. There is only a small gap between these two temperatures. If the operation temperature reaches the Néel temperature the effect of the exchange bias and therefore the pinning of a ferromagnetic layer disappears because the antiferromagnetic material becomes paramagnetic. A further disadvantage of the prior art is that the efficiency of the exchange bias of the pinning material, i.e. the antiferromagnet, drops caused by thermal charging or electrical spikes. Hence, some spins change their direction which influence the stability of the exchange bias. Furthermore, some antiferromagnetic materials show the disadvantage of losing the orientation of their spins caused by aging. There is also the fact that commonly used metallic antiferromagnets are prone to oxidation and corrosion phenomena. Another disadvantage is that often rather thick antiferromagnetic layers of about 50 nm or more are used as the exchange bias.

Exchange bias leads to a shift of the M(H) hysteresis because of uniaxial anisotropy. The exact control of the exchange bias is a difficult materials science problem because it depends on atomic details of the interface that are, by their very nature, difficult to measure. The magnitude and sign of the exchange coupling between a pair of atoms is a rapidly varying function of the atom-to-atom spacing.

Not all materials which are stated in the literature to be antiferromagnetic in bulk conform with high Néel temperature work. For example, $Fe_3Al$ was reported by G. Rassman and H. Wick, Arch. Eisenhuttenw., 33,115 (1963) to be antiferromagnetic with a high Néel temperature of 750 K; but iron-aluminum files at and near the $Fe_3Nl$ composition were tried and did not give unidirectional anisotropy. Other alloys have been reported to have a high value of $T_N$ but when they were tried, they also did not work. They include: Al—Cr alloys near $AlCr_2$ composition; MnPd alloys near MnPd composition; CrMn alloys from about 1% to 90% Mn. Neither CrMn nor MnPd has a stable $gamma_{Mn}$ phase at room temperature.

The state of the art shows that it is rather difficult to find suitable antiferromagnetic materials with advanced properties in order to produce unidirectional anisotropy. Furthermore, practical antiferromagnetic materials with Néel temperatures $T_N$>450 K are desired.

Since currently used magnetic devices, e.g. as part of magnetoresistive sensor, are not ideal for novel generations with higher operating temperature, improved structures of such magnetic devices are required.

SUMMARY OF THE INVENTION

Therefore, an object of the present invention is to overcome the disadvantages of the prior art.

It is another object of the present invention to achieve a magnetoresistive structure which induces a strong pinning effect at high operating temperature.

It is still another object of the present invention to optimize the properties of the magnetoresistive structure.

It is a further object of the present invention to provide an alternative pinning layer for a magnetic device having a high Néel temperature $T_N$.

It is still a further object of the present invention to allow the use of a thin pinning layer, e.g. in GMR devices.

It is also an object of the present invention to enable the manufacturing of an improved magnetoresistive structure.

The objects of the invention are achieved by the features of the enclosed claims. More specifically, the underlying concept of the present invention concerns at least an antiferromagnetic layer, which is in direct contact with a ferromagnetic layer for inducing an exchange bias in the ferromagnetic layer. Thus, the ferromagnetic layer is pinned by the antiferromagnetic layer, also referred to as the pinning layer. The antiferromagnetic or pinning layer comprises a compound from the group of orthoferrites, which show a variety of advantages. For example, these antiferromagnets can have a Néel temperature $T_N$ ranging from at least 623 K to 740 K depending on the compounds, and they can display a weak ferromagnetic moment. Therefore, a magnetic device comprising the mentioned structure can be used properly in an environment of a high operating temperature.

Such a compound can be described by the formula $RFeO_3$ with R a rare earth element or Yttrium. The possibility of substitution of the rare earth element shows the advantage that the basic properties, e.g. $T_N$ of the antiferromagnetic layer, can be adapted according to application requirements. In this structure, each element can be partially alloyed or substituted by other elements with the same valence such as for instance $R_{1-x}R^*_xFeO_{3\pm y}$ where $R^*$ is also a rare earth element and the index x is defined by $x \in \{0, \ldots, 1\}$. The compound can be also described by the formula $RFe_{1-x}Tm_xO_3$ with R a rare earth element or Yttrium, and TM a transition metal which can be one element of the groups IB to VIII. This allows a broad variety of possible combinations and an adaption of the pinning layer's properties according to special requirements.

The compound can be also doped by an element S being an element with another valence such as Barium, Strontium, Calcium, Potassium, or Sodium in compound $R_{1-x}S_xFeO_3$. The index $x \in \{0, \ldots, 1\}$. It is an advantage that the Néel temperature $T_N$ of the antiferromagnetic layer can be tuned between about 450 K and 760 K by the use of a suitable dopant. Furthermore, the oxygen stoichiometry can be changed as in $RFeO_{3\pm y}$ with y close to zero.

When the antiferromagnetic layer can be made very thin, for instance less than 50 nm, then the advantage occurs that the distance between a magnetic bit on a hard disk and a ferromagnetic layer of a sensor can be reduced. In general, the sensor can be brought much closer to the disc which can be advantageous for the density, the sensitivity, and the operation speed.

If the antiferromagnetic layer can be subjected to an appropriate strain, than the advantage occurs that the properties of the antiferromagnetic layer are tunable. Furthermore, the structure of the antiferromagnetic layer can be distorted which also might change or adapt the properties of the antiferromagnetic layer.

A magnetic device according to the present invention can be part of the a magnetic recording sensor, e.g. a magnetic read head or a GMR sensor, a magnetic random access memory (MRAM), or even a magnetic recording medium. In general, the invention can be used wherever a shifted magnetization loop or an adapted pinning layer is needed.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying schematic drawings, wherein:

FIG. 1b shows a schematic illustration of a magnetoresistive sensor having an inverted structure to the sensor of FIG. 1a.

Figure 1A:
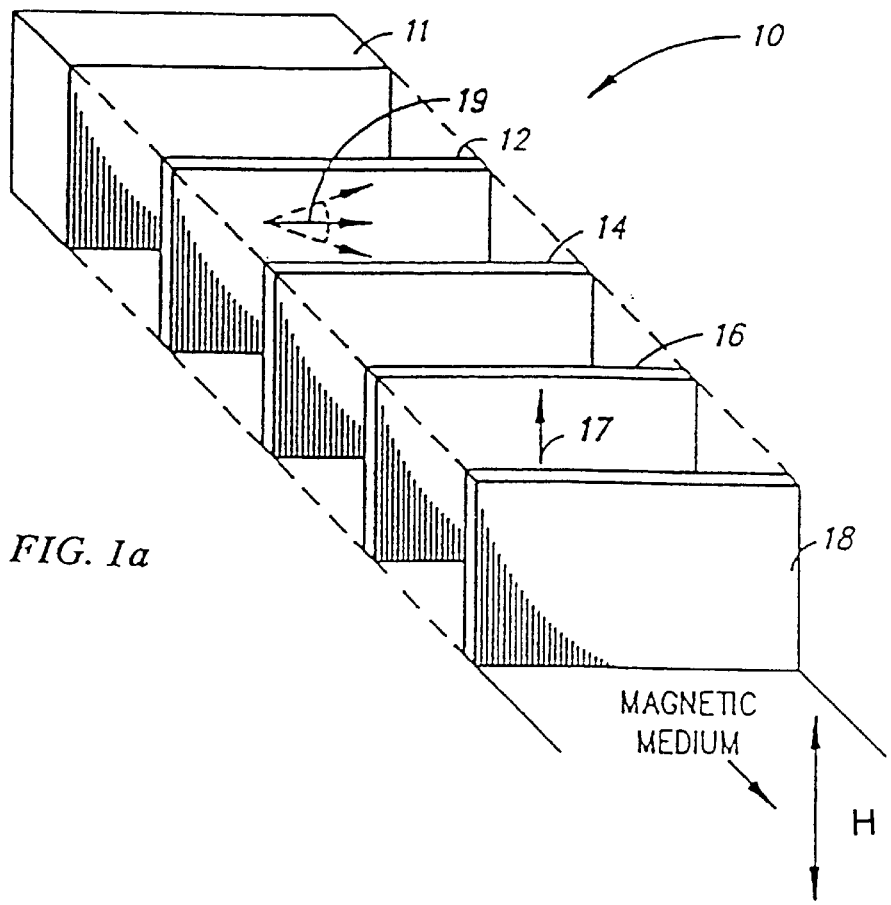
FIG. 1a shows a schematic illustration of a magnetoresistive sensor.

All the figures are for the sake of clarity not shown in real dimensions, nor are the relations between the dimensions shown in a realistic scale.

DETAILED DESCRIPTION OF THE PREFERRED EMBODIMENT

With general reference to the figures and with special reference to FIG. 1a and FIG. 1b, the essential structure of a magnetic device as part of a magnetoresistive sensor, which bases on the so-called "spin-valve" or "giant magnetoresistive (GMR)" effect, is described in more detail below.

First, some details about orthoferrites are addressed. The orthoferrites have the formula $RFeO_3$ with R a rare earth or Y. Their structure is that of a distorted perovskite with the Pbnm space group and lattice parameters: a=5.5553 Å; b=5.5663 Å and c=7.8545 Å in the case of $LaFeO_3$. The magnetic moment points in the a-axis direction, each cation in the Fe sublattice being antiferromagnetically coupled with its six nearest neighbors. These materials have a $T_N$ ranging from 740 K for La to 623 K for Lu and display a weak ferromagnetic moment due to a slight tilting of the Fe—O octahedra (0.6 degrees), depending on the rare-earth size. In the case of $LaFO_3$, the magnetic properties are determined by the $Fe^{+3}$ ions. For the other compounds, the magnetic state of the rare earth ion (Ho, Gd, . . . ) also plays a role. Furthermore, the magnetism in these compounds can be strongly suppressed using high pressures. For instance, in $LaFeO_3$ at 300 K and a hydrostatic pressure of 45–55 Gpa, only a nonmagnetic phase is observed by Mössbauer spectroscopy.

In current GMR read heads, one of two ferromagnetic layers is pinned by an antiferromagnetic layer, also referred to as the pinning layer. The ferromagnetic and the antiferromagnetic layer are deposited on each other whereby the structure of the antiferromagnetic layer is set by aligning its spins in a magnetic field. Two competing technologies are state of the art, where either a metallic antiferromagnetic layer or an insulating oxide antiferromagnetic layer is used. The GMR sensor is a resistance sensor in which the antiferromagnetic layer is connected in a parallel configuration. Thus, the use of an oxide layer improves resistance sensitivity whereas a metallic antiferromagnetic layer improves resistance sensitivity whereas a metallic antiferromagnetic layer shows the drawback that the resistance sensitivity is reduced. Nevertheless, such a metallic antiferromagnetic layer tends to oxidize or corrode through the grain boundaries which hence increases the interface area. It is further stated that an oxide antiferromagnetic layer, e.g. NiO, has a Néel temperature $T_N$ that is close to today's operating temperatures of heads and is therefore not ideal for new and faster generations of sensor heads with increased operating temperatures. The following device and the manufacturing thereof overcomes the disadvantages of the prior art.

A typical GMR sensor 10 is depicted in a three-dimensional view showing an unfolded layered structure. As illustrated in FIG. 1a, the GMR sensor 10 comprises a suitable substrate 11 such as glass, ceramic or a semiconductor, for example, upon which deposited a first layer 12 of soft ferromagnetic material, a second layer 14 of a nonmagnetic metallic material, a third layer 16 of ferromagnetic material which has preferably hard magnetic properties in order to fix its magnetization in position, and a fourth layer 18 of antiferromagnetic material, also referred to as pinning layer 18. According to the preferred embodiment of the present invention one or both of the ferromagnetic layers 12, 16 is/are either Co, NiCo, cobalt alloy, such as $Co_{80}Fe_{20}$, CoZr, CoMoNb, or NiFeCo, Fe, $Ni_{80}Fe_{20}$, or any other suitable ferromagnetic material. The nonmagnetic metallic material of the second layer 14, also referred to as spacer layer 14, may be Cu or other noble metal such as silver (Ag) and gold (Au). The third layer 16 is fixed or pinned by the pinning layer 18. The layers are deposited as thin film layers. The two layers 12, 16 of ferromagnetic material are oriented with their magnetization at an angle of about 90 degrees with respect to each other in the absence of an applied magnetic field. In addition, the magnetization of the third layer 16 is fixed in position as shown by a first arrow 17. The magnetization in the first layer 12, in the absence of an applied magnetic field, is shown by a second arrow 19. Changes in magnetization in the first layer 12 are by rotation, in response to an applied magnetic field such as a magnetic field H, as indicated by dotted lines of the second arrow 19 on the first layer 12 in FIG. 1a.

In the embodiment shown in FIG. 1a, the pinning layer 18 comprises a compound taken from the group of orthoferrites that, in one embodiment, is $LaFeO_3$. This orthoferrite is an exchange biasing material of high resistance and has a Néel temperature $T_N$ of about 740 K which is deposited in direct contact with the third layer 16 so that a biasing field can be produced by exchange coupling as is known in the art. The structure of FIG. 1a may be inverted, so that the pinning layer 18 is deposited first, followed by layer 16, 14, and 12 as depicted in FIG. 1b.

Figure 1B:
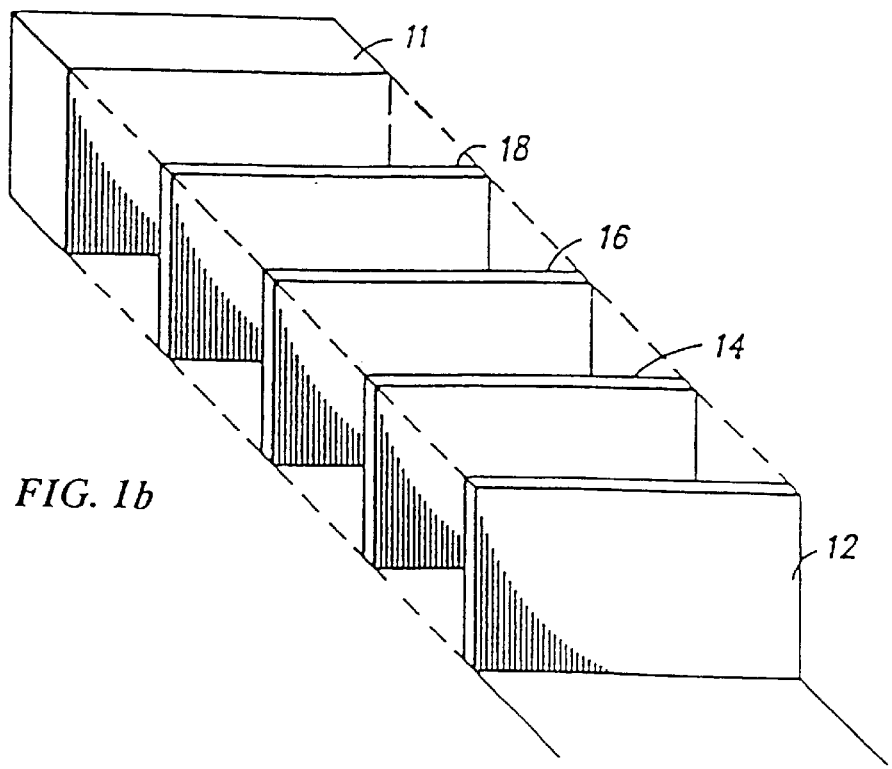

With reference to FIG. 1b, an experimental deposition of the antiferromagnetic layer 18 and further layers upon a substrate 11 is described in detail. FIG. 1b shows an inverted structure to FIG. 1a. Therefore, the same numbering for the same structured layers is used. On the substrate 11, the antiferromagnetic layer 18 is deposited. Thereon, a ferromagnetic layer 16, a nonmagnetic layer 14, and a further ferromagnetic layer 12 are deposited.

The antiferromagnetic layer 18 is grown on a $SrTiO_3$ (001) substrate 11, also referred to as STO, by sequential molecular beam deposition (MBE) of a La monolayer followed by a Fe monolayer under a beam of atomic oxygen. Other deposition techniques can be used as well, e.g., sputtering, laser ablation, or metalorganic chemical vapor deposition (MOCVD). The conditions showed a background oxygen pressure of about $3 \times 10^{-6}$ Torr and a substrate temperature of about 720 K. The deposition was also performed at a high temperature of 1020 K. For both temperatures, X-ray diffraction reveals that the layers are crystalline and epitaxial. The antiferromagnetic layer 18 comprising $LaFeO_3$ has a thickness of about 20 nm and the [001] orientation. On the $LaFeO_3$ layer 18, a 3 nm thick ferromagnetic layer 16, in one embodiment Fe, has been subsequently deposited. This structure of $LaFeO_3$/Fe bilayer 18, 16 is then heated up to 380 K and cooled in a magnetic field in order to set the antiferromagnetic layer 18. The heating, cooling, and field conditions can be changed in order to obtain desired properties and a strong pinning effect. Further, the antiferromagnetic layer 18 can be doped by an appropriate dope-material such as Barium, Strontium, Calcium, Potassium, Lithium, or Sodium. The Néel temperature $T_N$ is therewith tunable between 450 K and 760 K, which shows the advantage that antiferromagnetic layers, and therewith, magnetic devices for special applications and defined temperature ranges can be manufactured.

A magnetization measurement of the $LaFeO_3$/Fe structure has been performed, which is discussed with reference to FIG. 3. The largest exchange bias was obtained so far on the structure deposited on STO (001). Despite setting the antiferromagnet layer 18 at a temperature significantly below the Néel temperature, with $T = T_N/2$, the magnetization measurement indicates an exchange bias of about 50 Oe (Oersted) for only a 20 nm thick antiferromagnetic layer 18 comprising $LaFeO_3$. Subsequently, the nonmagnetic layer 14 and the further ferromagnetic 12 can be deposited by using one of the deposition techniques.

Figure 2:
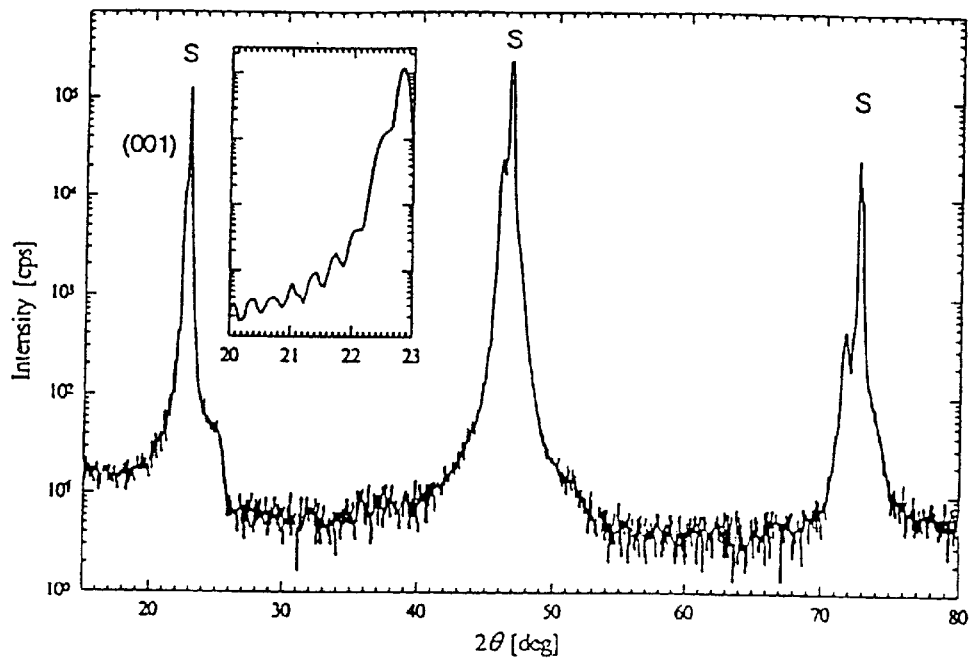
FIG. 2 is a plot of X-ray diffraction pattern of a $LaFeO_3$ layer.

FIG. 2 shows an X-ray diffraction pattern of the $LaFeO_3$ layer 18 grown on the STO [100] substrate 11. Each of the peaks corresponds to reflection from a particular plan in the crystalline structure, as identified in FIG. 2. Besides the substrate peaks indicated by S, only peaks related to the [001] diffraction lines of $LaFeO_3$ are visible suggesting an epitaxial layer. Around the layer peaks one observes small peaks, so-called finite size oscillations proving that the roughness of the layer is of the order of one unit cell. A detailed analyses of the peak positions reveals that this $LaFeO_3$ layer 18 is under compressive strain due to the lattice mismatch with the cubic STO, whereby a=3.905 Å, giving rise to a larger c-axis lattice parameter of 3.954 Å.

Figure 3:
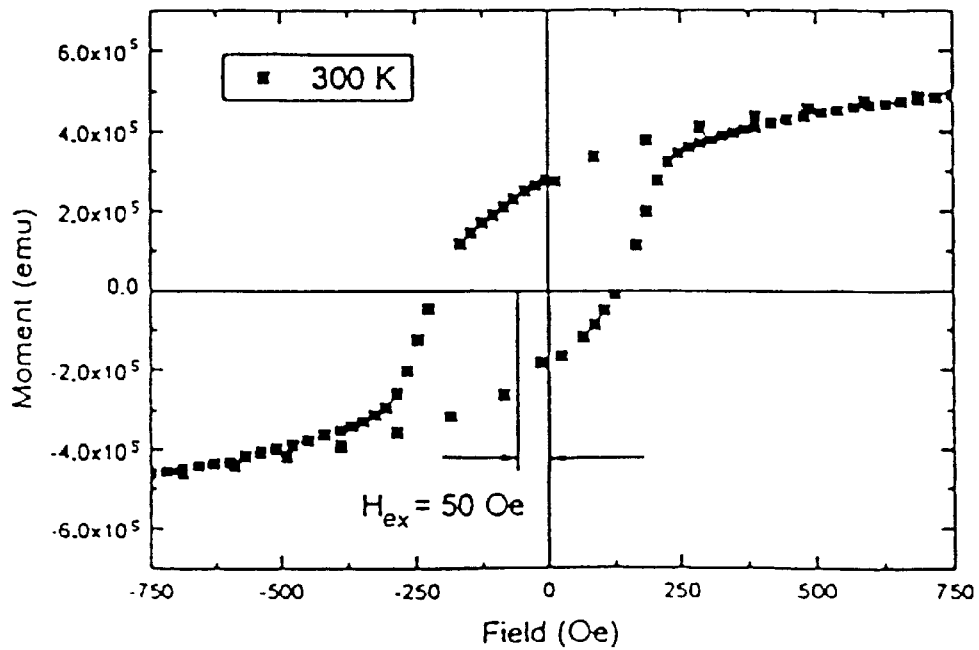
FIG. 3 shows a hysteresis loop obtained on a $LaFeO_3$/Fe bilayer indicating an exchange bias of about 50 Oe.

FIG. 3 shows a typical hysteresis loop, also referred to as M (H) loop, obtained on the $LaFeO_3$/Fe bilayer 18, 16 grown on the STO (100) substrate 11. Thereby the $LaFeO_3$ layer with a thickness of 25 nm was deposited at 1020 K, whereas the Fe layer with a thickness of 3 nm was deposited at 300 K. The measurement was performed at 300 K using a SQUID magnetometer after setting the $LaFeO_3$ layer at 380 K. The exchange bias $H_{ex}$ estimated from the measurement is 50 Oe (Oersted). The simple picture of the exchange coupling suggests a parallel alignment of the Fe spins to those on the $LaFeO_3$ layer 18. In order to confirm this, Kerr measurements were performed on another $LaFeO_3$/Fe bilayer 18, 16 grown on the STO (001) substrate 11. For this, the $LaFeO_3$ layer with a thickness of 40 nm was deposited at 720 K, whereas the Fe layer with a thickness of 8 nm was deposited at 370 K after setting the antiferromagnetic layer at 400 K along different azimuthal directions.

Figure 4A:
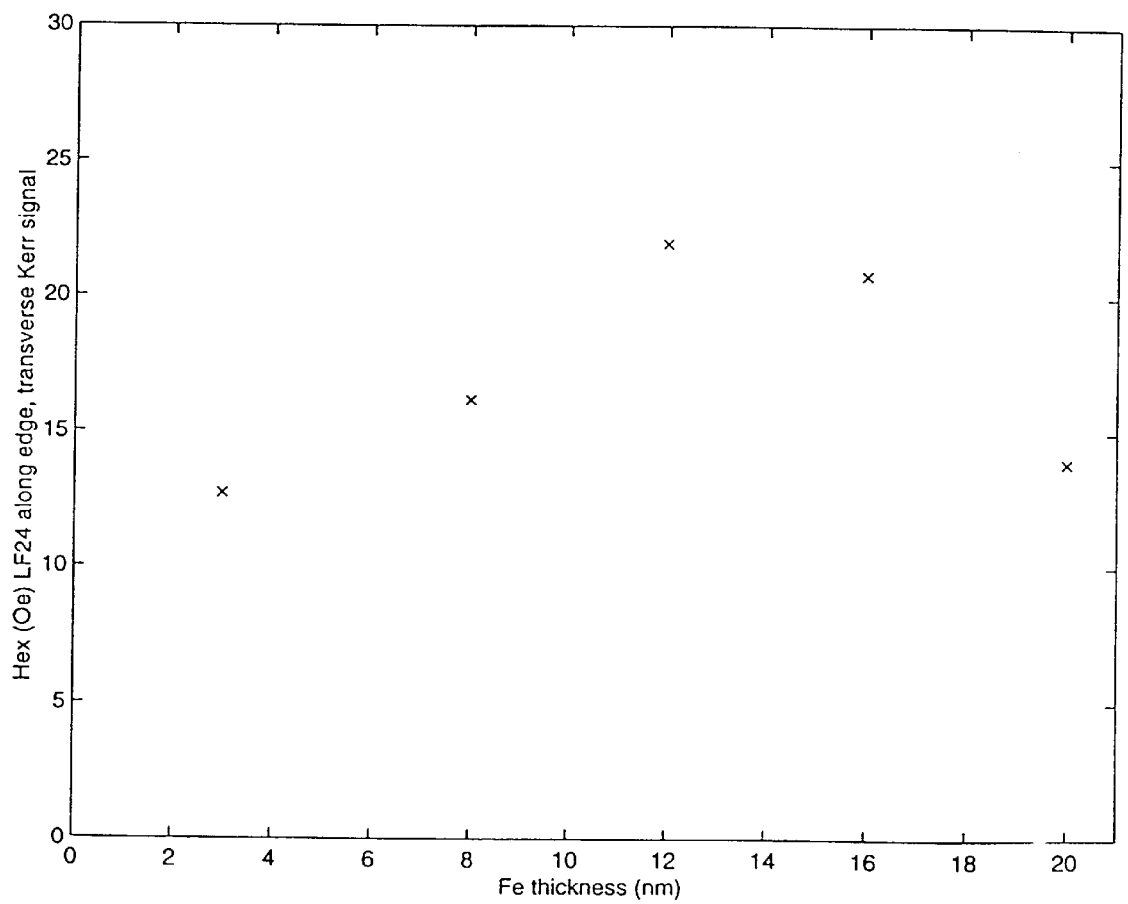
FIG. 4a shows the exchange bias as a function of the Fe thickness measured along the [100] direction.
Figure 4B:
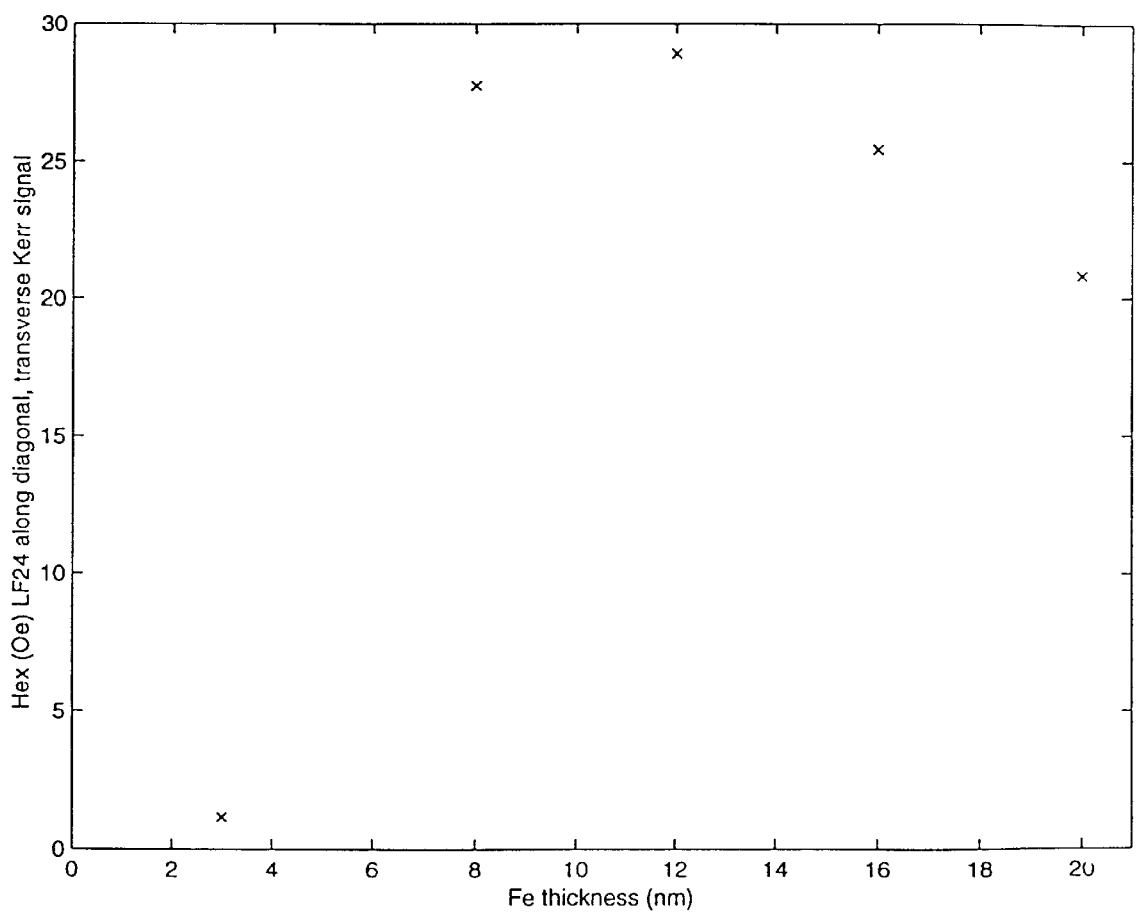
FIG. 4b shows the exchange bias as a function of the Fe thickness measured along the [110] direction.

FIG. 4a and FIG. 4b show a diagram of the exchange bias as a function of the thickness. A typical signature of exchange bias is its film thickness dependence. For a $LaFeO_3$/Fe structure grown on STO (001), the dependence of $He_{ex}$ with ferromagnetic Fe film thickness is given in FIG. 4a and FIG. 4b. Thereby, FIG. 4a shows the result of a measuring along the [100] direction, whereas FIG. 4b shows the result of a measuring along the [110] direction. It is evident that exchange bias peaks at a certain Fe thickness, typically around 8 to 12 nm. The decrease with larger Fe thickness is expected for fundamental energetic reasons while the drop at low Fe thickness is not yet understood.

Figure 5:
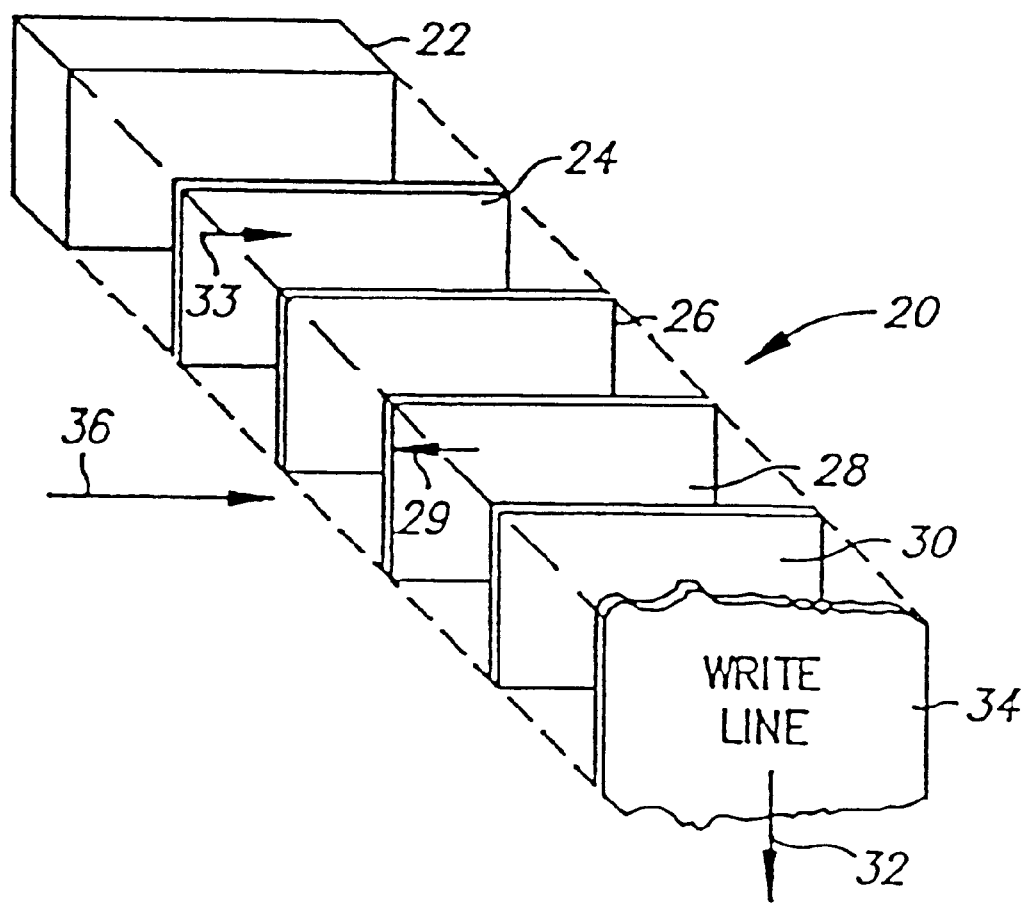
FIG. 5 shows a schematic illustration of a magnetic storage device.

FIG. 5 shows a further embodiment as a schematic three-dimensional illustration of a magnetic storage element 20, also referred to as magnetic random access storage device (MRAM), in an unfolded layered structure. As illustrated in FIG. 5, the storage element 20 comprises a suitable substrate 22, such as glass, ceramic or a semiconductor, upon which are deposited a first thin film layer 24 of soft ferromagnetic material, a second thin film layer 26 of a nonmagnetic metallic conducting material such as copper and a third thin film layer 28 of ferromagnetic material. Thereon, an antiferromagnetic layer 30, also referred to as pinning layer 30, is deposited. The storage element 20 is rectangular in cross-section, and the easy axis of magnetization is along the length of the storage element. The magnetization direction of the third thin film layer 28 is fixed, as indicated by a first magnetization arrow 29, to be parallel to the longitudinal dimension of the storage element 20, such as by exchange coupling with the antiferromagnetic layer 30. The antiferromagnetic layer 30 comprises a compound from the group of orthoferrites, here $LaFeO_3$. The advantage of such a structured device is its applicability in an environment with high temperatures. Because of the high Néel temperature $T_N$ of the orthoferrites, such a magnetic storage element 20 is usable and operatable up to a temperature approaching $T_N$.

The magnetization of layer 24 is constrained by the uniaxial anisotropy and the shape geometry to lay in the longitudinal direction of element 20, either parallel or antiparallel, as it is indicated by a second magnetization arrow 33, to the fixed direction of magnetization of the third thin film layer 28. Switching of the storage element 20 between a "1" state and a "0" state is accomplished by simultaneously applying a transverse field and a longitudinal field to element 20. The longitudinal field is induced by a longitudinal write current 32 in a write line 34 provided by a conductor that extends orthogonal to the length of the storage element 20. The transverse field is induced by a transverse write/sense current 36 flowing lengthwise through the element 20. If desired to increase stability by enhancing the transverse field, additional transverse write/sense current may be provided via an optional separate conductor that extends lengthwise through the storage element and is interposed between substrate 22 and an insulating layer that contacts layer 24.

The electrical resistance is at a minimum when the magnetization of the first thin film layer 34 is parallel to that of the fixed third thin film layer 28, and is at a maximum when the magnetization of the first thin film layer 24 is antiparallel to that of the fixed third thin film layer 28.

While the invention has been particularly shown and described with reference to a preferred embodiment, it will be understood by those skilled in the art that various changes in form and detail may be made therein without departing from the spirit and scope of the invention.

What is claimed is:

1. A magnetic device having at least an antiferromagnetic layer in contact with a ferromagnetic layer for inducing an exchange bias in the ferromagnetic layer, wherein said antiferromagnetic layer comprises a compound describable by a formula $R_{1-x}S_xFeO_3$; wherein R is a rare earth element or Yttrium;

S is Barium, Strontium, Nickel, Calcium, Potassium, Lithium, or Sodium; and the index x is defined by $0<x<1$.

2. The magnetic device according to claim 1, wherein said antiferromagnetic layer has a Néel temperature $T_N>450$ K.

3. The magnetic device according to claim 2, wherein said Néel temperature $T_N$ is adaptable by using an appropriate dopant.

4. The magnetic device according to claim 1, wherein said antiferromagnetic layer has a thickness t, with t<50 nm.

5. The magnetic device according to claim 1, wherein said antiferromagnetic layer is subjected to a strain.

6. The magnetic device according to claim 1, wherein said antiferromagnetic layer has a distorted structure.

* * * * *

UNITED STATES PATENT AND TRADEMARK OFFICE
CERTIFICATE OF CORRECTION

PATENT NO. : 6,631,057 B1
DATED : October 7, 2003
INVENTOR(S) : Allenspach et al.

It is certified that error appears in the above-identified patent and that said Letters Patent is hereby corrected as shown below:

<u>Title page,</u>
Item [75], Inventors, delete "Rolf Allenspach, Adliswil (CH); Jean Fompeyrine, Wædenswil (CH); Eric Fullerton, Morgan Hill, CA (US); Jean Pierre Locquet, Horgen (BE); Timothy Moran, Springfield, CA (US); Maria Seo, Lausanne (CH)" and replace with -- Rolf Allenspach, Adliswil (CH); Jean Fompeyrine, Wædenswil (CH); Eric Fullerton, Morgan Hill, CA (US); Jean Pierre Locquet, Horgen (CH); Timothy Moran, San Jose, CA (US); Jin Won Seo, Lausanne (CH) --.

Signed and Sealed this

Twenty-third Day of March, 2004

JON W. DUDAS
*Acting Director of the United States Patent and Trademark Office*